United States Patent
Lo et al.

(10) Patent No.: US 10,770,119 B2
(45) Date of Patent: Sep. 8, 2020

(54) MEMORY CIRCUIT

(71) Applicant: MACRONIX International Co., Ltd., Hsinchu (TW)

(72) Inventors: Su-Chueh Lo, Hsinchu (TW); Ken-Hui Chen, Hsinchu (TW); Kuen-Long Chang, Taipei (TW); Ming-Chih Hsieh, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/534,992

(22) Filed: Aug. 7, 2019

(65) Prior Publication Data

US 2020/0185010 A1 Jun. 11, 2020

Related U.S. Application Data

(60) Provisional application No. 62/775,911, filed on Dec. 6, 2018.

(51) Int. Cl.
*G11C 5/14* (2006.01)
*G11C 7/10* (2006.01)
*G11C 7/06* (2006.01)

(52) U.S. Cl.
CPC .............. *G11C 5/147* (2013.01); *G11C 5/148* (2013.01); *G11C 7/06* (2013.01); *G11C 7/1069* (2013.01); *G11C 7/1096* (2013.01); *G11C 5/14* (2013.01)

(58) Field of Classification Search
None
See application file for complete search history.

(56) References Cited

U.S. PATENT DOCUMENTS

| 5,680,352 | A | 10/1997 | Roohparvar | |
|---|---|---|---|---|
| 6,366,521 | B1 * | 4/2002 | Roohparvar | G11C 7/1045 365/226 |
| 6,922,372 | B2 * | 7/2005 | Suzuki | G11C 7/1051 365/189.05 |
| 7,184,351 | B2 * | 2/2007 | Ito | G11C 11/406 365/222 |

(Continued)

FOREIGN PATENT DOCUMENTS

TW 200919181 5/2009

OTHER PUBLICATIONS

"Office Action of Taiwan Counterpart Application," dated Feb. 17, 2020, p. 1-p. 8.

*Primary Examiner* — Tan T. Nguyen
(74) *Attorney, Agent, or Firm* — J.C. Patents

(57) ABSTRACT

A data receiving stage circuit of a memory circuit receives a serial input signal and a chip enable signal. A data writing circuit of the memory circuit generates at least one of a command signal and a data signal according to the serial input signal. A power supply circuit of the memory circuit generates an operating voltage for a memory cell array to perform a data access operation. A data output stage circuit of the memory circuit outputs a readout data. A controller of the memory circuit performs a switching operation of an operating state of the memory circuit according to a change of the chip enable signal. The controller determines a disable or enable state of the data receiving stage circuit, the data writing circuit, the power supply circuit, and the data output stage circuit according to the operating state.

10 Claims, 8 Drawing Sheets

(56) References Cited

U.S. PATENT DOCUMENTS

| | | | |
|---|---|---|---|
| 7,471,587 B2 * | 12/2008 | Kawakubo | G11C 11/406 365/222 |
| 7,979,629 B2 | 7/2011 | Lee et al. | |
| 2009/0113118 A1 | 4/2009 | Lee et al. | |

* cited by examiner

MEMORY CIRCUIT

CROSS-REFERENCE TO RELATED APPLICATION

This application claims the priority benefit of U.S. provisional application Ser. No. 62/775,911, filed on Dec. 6, 2018. The entirety of the above-mentioned patent application is hereby incorporated by reference herein and made a part of this specification.

BACKGROUND

Technical Field

The invention relates to a memory circuit, and particularly relates to a memory circuit having a rail-to-rail input buffer and a state controller.

Description of Related Art

FIG. 1A is a schematic diagram of a conventional flash memory framework. Referring to FIG. 1A, a memory controller 110 provides a chip enable signal CS #, a reference voltage VREF, a clock signal CLK and a serial input signal SIO to a flash memory 120. The flash memory 120 performs an access operation to a memory cell array (not shown) in the flash memory 120 according to a command in the serial input signal SIO, and outputs a readout data and a data strobe signal DQS in a serial manner.

For flash memory, an input buffer of the memory controller 110, based on the Stub Series Terminated Logic (SSTL) standard or the High Temperature Storage Life (HTSL) standard, has no static current but cannot be used to process high-speed signals. A differential type input buffer can be used to process high-speed signals but has a static current. Moreover, a noise tolerance of the input buffer of the flash memory 120 is easily changed. FIG. 1B is a schematic diagram of an input buffer of the conventional flash memory. Referring to FIG. 1B, in case that the input buffer 121 is enabled according to an enable signal EN, when an input signal IN is around a transition point (for example, during a process of being transited from a low logic level to a high logic level), a state of an output signal OUT may have a disturbance due to a noise in the input signal.

SUMMARY

The invention is directed to a memory circuit, which is capable of being operated under high-speed signals, and has effects of low power consumption, low distortion, low noise, etc.

The invention provides a memory circuit including a data receiving stage circuit, a data writing circuit, a memory cell array, a power supply circuit, a data output stage circuit and a controller. The data receiving stage circuit is configured to receive a serial input signal and a chip enable signal. The data writing circuit is coupled to the data receiving stage circuit, and is configured to generate at least one of a command signal and a data signal according to the serial input signal. The power supply circuit is configured to generate an operating voltage for the memory cell array to perform a data access operation. The data output stage circuit is coupled to the memory cell array, and is configured to output a readout data. The controller is coupled to the data writing circuit and the power supply circuit, and is configured to perform a switching operation of an operating state of the memory circuit according to a changing state of the chip enable signal. The controller determines a disable or enable state of the data receiving stage circuit, the data writing circuit, the power supply circuit and the data output stage circuit according to the operating state of the memory circuit.

Based on the above description, the memory circuit of the invention has advantages of high-speed signal operation, low distortion, low noise, etc. Moreover, in the invention, the effect of low power consumption is achieved by configuring a state controller to control the enable or disable state of each of the components in the memory circuit.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
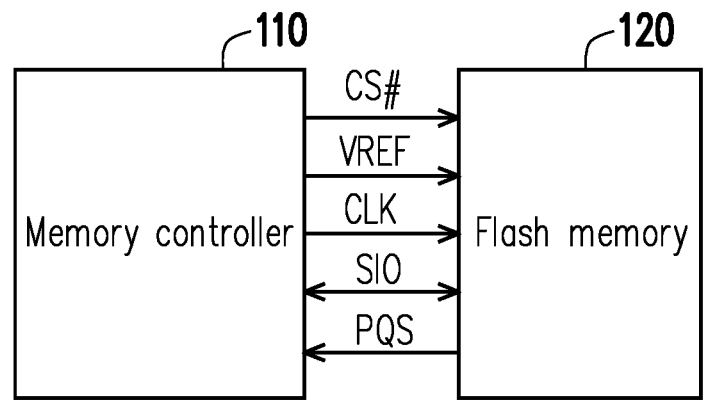
FIG. 1A illustrates a schematic diagram of a conventional flash memory framework.
Figure 1B:
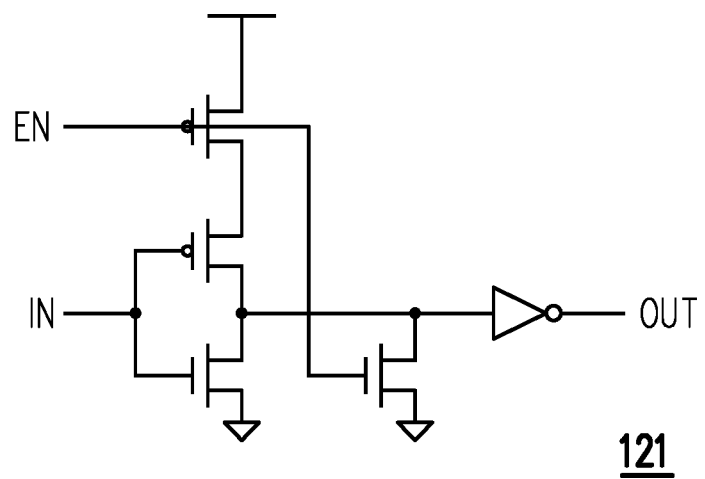
FIG. 1B is a schematic diagram of an input buffer of a conventional flash memory.
Figure 2:
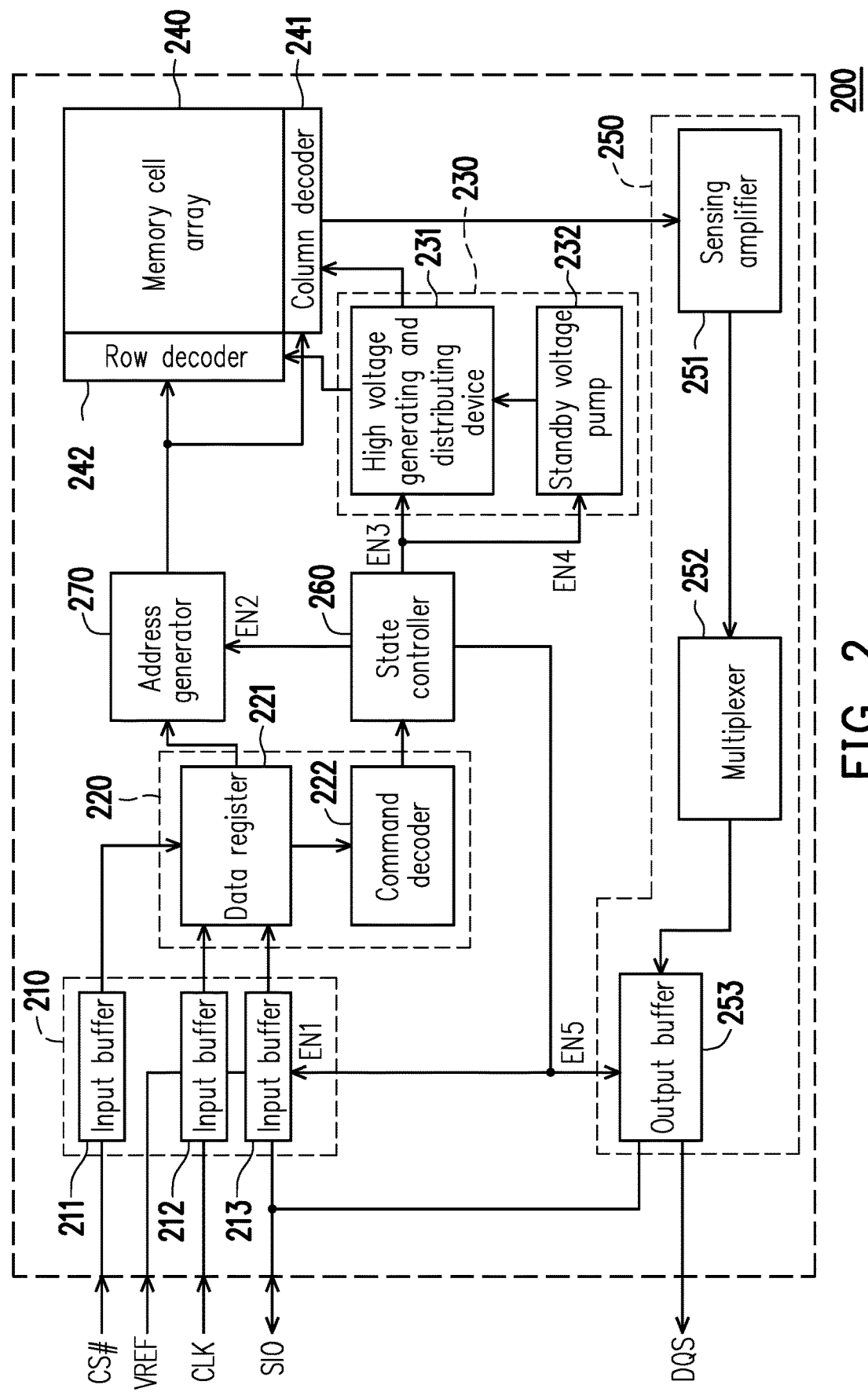
FIG. 2 is a schematic diagram of a memory circuit according to an embodiment of the invention.

FIG. 2 is a schematic diagram of a memory circuit according to an embodiment of the invention. Referring to FIG. 2, the memory circuit 200 includes a data receiving stage circuit 210, a data writing circuit 220, a power supply circuit 230, a memory cell array 240, a data output stage circuit 250 and a state controller 260 and an address generator 270. The data receiving stage circuit 210 is configured to receive a serial input signal SIO and a chip enable signal CS # provided by an external controller. The data receiving stage circuit 210 may include a plurality of input buffers to respectively receive the serial input signal SIO, a clock signal CLK and the chip enable signal CS #.

The data writing circuit 220 is coupled to the data receiving stage circuit 210, and is configured to generate at least one of a command signal and a data signal according to the serial input signal SIO and the clock signal CLK. The data writing circuit 220 may generate the corresponding command signal according to the content of the serial input signal SIO. The command signal may be a writing command, a reading command or a power down command.

The power supply circuit 230 is configured to generate an operating voltage for the memory cell array 240 to perform a data access operation. The memory cell array 240 may include a column decoder 241 and a row decoder 242. The data output stage circuit 250 is coupled to the memory cell array 240, and is configured to output a readout data. The state controller 260 is coupled to the data writing circuit 220 and the power supply circuit 230, and is configured to perform a switching operation of an operating state of the memory circuit 200 according to a changing state of the chip enable signal CS #. The controller 260 determines a disable or enable state of the data receiving stage circuit 210, the data writing circuit 220, the power supply circuit 230 and the data output stage circuit 250 according to the operating state of the memory circuit 200.

The chip enable signal CS # may be provided to the state controller 260 through a data register 221 and a command decoder 222. The data register 221 may receive and temporarily store an input signal of the data receiving stage circuit 210 and output signals of the input buffers 213. The command decoder 222 may generate at least one of the command signal and the data signal according to an output signal of the data register 221.

The address generator 270 may generate a memory cell address corresponding to the data access operation according to the output signal of the input buffer 212 and the output signal of the input buffer 213. The memory cell address is decoded by the column decoder 241 and the row decoder 242, so that the data signal is written into a specified memory cell of the memory cell array 240, or the data signal is read out from the specified memory cell.

The power supply circuit 230 may include a high voltage generating and distributing device 231 and a standby voltage pump 232. The high voltage generating and distributing device 231 and the standby voltage pump 232 respectively generate a first voltage and a second voltage for the memory cell array 240 to execute the data access operation.

In the embodiment, the data receiving stage circuit 210 may include the input buffers 211-213. The data writing circuit 220 may include the data register 221 and the command decoder 222. The power supply circuit 230 may include the high voltage generating and distributing device 231 and the standby voltage pump 232. The data output stage circuit 250 may include a sensing amplifier 251, a data multiplexer 252 and an output buffer 253. The sensing amplifier 251 is coupled to the memory cell array 240, and is configured to generate at least one sensing signal. The data multiplexer 252 is coupled to the sensing amplifier 251, and is configured to receive the at least one sensing signal, and output one of the at least one sensing signal as a readout data. The output buffer 253 is configured to output the readout data and a data strobe signal (DQS). The state controller 260 may generate enable signals EN1-EN5 to respectively control enable or disable states of the input buffers 212 and 213, the address generator 270, the high voltage generating and distributing device 231, the standby voltage pump 232 and the data output stage circuit 250.

According to the above description, those skilled in the art should understand and implement the aforementioned input buffer 211, the data writing circuit 220, the address generator 270, the memory cell array 240 and the data output stage circuit 250, and details thereof are not repeated. The stage controller 260 is described in detail below.

Referring to a following table and FIG. 2, the following table lists enable and disable states of various components corresponding to various operating states in the memory circuit 200. The state controller 260 performs a switching operation of the operating states of the memory circuit 200 according to the output signal generated by the command decoder 222 and a changing state of the chip enable signal CS #. In an embodiment, the operating states of the memory circuit 200 include an active state, a standby state and a power down state. Each of the components of the memory circuit 200 is enabled or disabled according to the operating state determined by the state controller 260, so as to achieve a low power consumption effect. In another embodiment, the operating states of the memory circuit 200 may further include a deep power down state. Compared to the power down state the state controller 260 may disable more components under the deep power down state. The state controller 260 may be a circuit designed according to a finite state machine by a Hardware Description Language or any other design method well known to those of ordinary skills in the art.

|  | Active state | Standby state | Power down state | Deep power down state |
| --- | --- | --- | --- | --- |
| Input buffer 211 | Enable | Enable | Enable | Enable |
| Input buffer 212, 213 | Enable | Enable | Disable | Disable |
| Data register 221 | Enable | Enable | Enable | Enable |
| Command decoder 222 | Enable | Enable | Enable | Enable |
| Address generator 270 | Enable | Enable | Enable | Enable |
| Standby voltage pump 232 | Enable | Enable | Enable | Disable |
| High voltage generating and distributing device 231 | Enable | Disable | Disable | Disable |
| Sensing amplifier 251 | Enable | Disable | Disable | Disable |
| Data multiplexer 252 | Enable | Disable | Disable | Disable |
| Output buffer 253 | Enable | Disable | Disable | Disable |

It should be noted that although the above table exemplifies the enabling and disabling of various components in the memory circuit for various operating states, the present invention is not limited thereto. In other embodiments, the enabling and disabling situations of the various components in the memory circuit corresponding to various operating states may be different from the above table according to actual design requirements. As long as the effect of the low power consumption is achieved, it is within the scope of the present invention.

Figure 3:
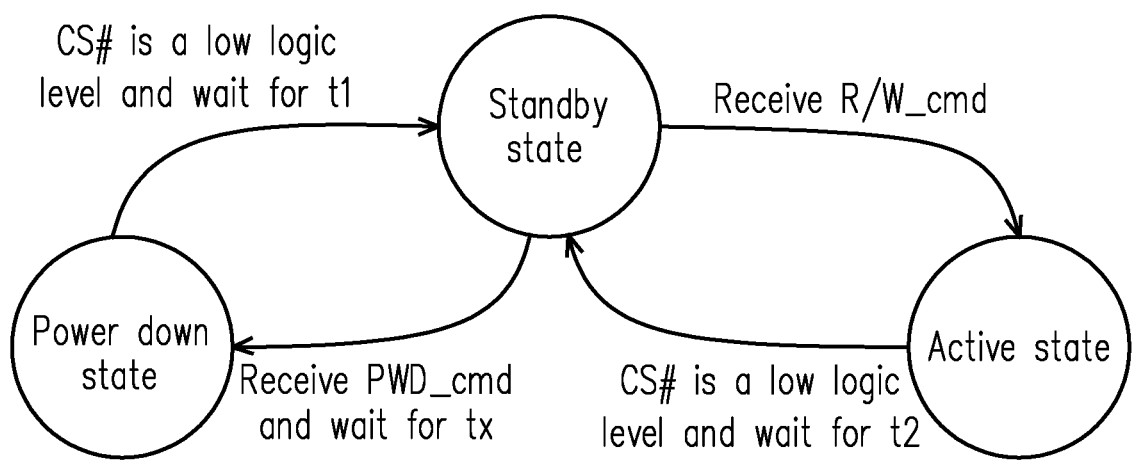
FIG. 3 is a schematic diagram of a state machine according to an embodiment of the invention.
Figure 4:
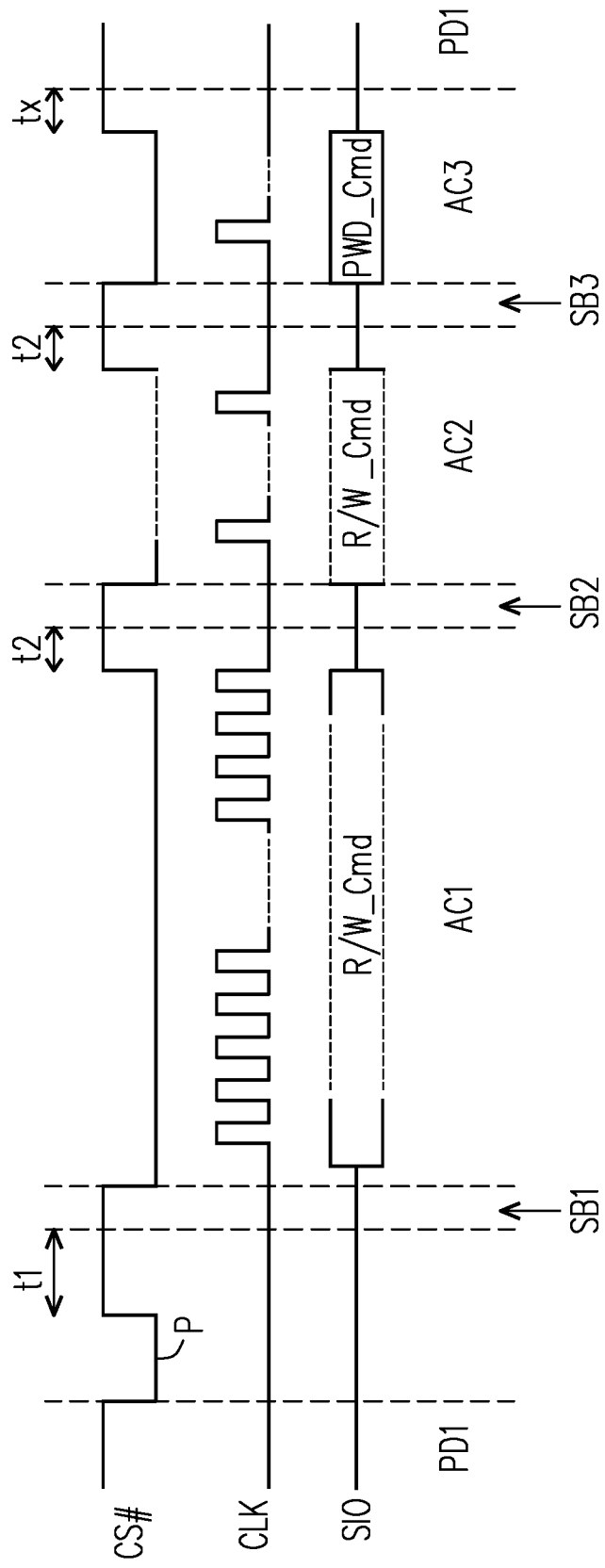
FIG. 4 is a waveform diagram according to an embodiment of the invention.

FIG. 3 is a schematic diagram of a state machine according to an embodiment of the invention, and FIG. 4 is a waveform diagram according to an embodiment of the invention. Referring to FIG. 2, FIG. 3 and FIG. 4, the operating states of the memory circuit 200 may include the standby state, the active state and the power down state, and the aforementioned operating states are controlled by the state controller 260. In view of an operation detail, under a power down state PD1, the state controller 260 first detects a pulse signal P (for example, a low voltage pulse) on the chip enable signal CS #, and after the pulse signal P, when the state controller 260 determines that the chip enable signal CS # is maintained on a first predetermined logic level (for example, a high logic level) by a time interval t1, the state controller 260 may enter a standby state SB1. The state controller 260 is configured to enable the data receiving stage circuit 210 and the data writing circuit 220 and disable the power supply circuit 230 and the data output stage circuit 250 in the standby state SB1. To be specific, in the standby state SB1, the state controller 260 generates the enable signal EN1 to disable the input buffers 212 and 213, the state controller 260 generates the enable signal EN3 to disable the high voltage generating and distributing device 231 of the power supply circuit 230, and the state controller 260 generates the enable signal EN4 to enable the standby voltage pump 232 of the power supply circuit 230.

Based on the above description, after the chip enable signal CS # is changed to a second predetermined logic level (for example, a low logic level), the state controller 260 enters an active state AC1, and receives a read/write command R/W_cmd. The state controller 260 determines to enable the data receiving stage circuit 210, the data writing circuit 220, the power supply circuit 230 and the data output stage circuit 250 according to the active state AC1. To be specific, under the active state AC1, the state controller 260 generates the enable signals EN3 and EN4 to respectively enable the high voltage generating and distributing device 231 and the standby voltage pump 232 of the power supply circuit 230.

Based on the above description, after the chip enable signal CS # is changed to the first predetermined logic level, when the state controller 260 determines that the chip enable signal CS # is maintained on the first predetermined logic level by a time interval t2, the state controller 260 re-enters a standby state SB2.

Based on the above description, after the chip enable signal CS # is changed to the second predetermined logic level, the state controller 260 enters an active state AC2, and receives the read/write command R/W_cmd.

Based on the above description, after the chip enable signal CS # is changed to the first predetermined logic level, when the state controller 260 determines that the chip enable signal CS # is maintained on the first predetermined logic level by the time interval t2, the state controller 260 re-enters a standby state SB3.

Based on the above description, after the chip enable signal CS # is changed to the second predetermined logic level, the state controller 260 enters an active state AC3, and receives a power down command PWD_cmd.

Based on the above description, after the chip enable signal CS # is changed to the first predetermined logic level, when the state controller 260 determines that the chip enable signal CS # is maintained on the first predetermined logic level by the time interval tx, the state controller 260 re-enters a power down state PD1. The state controller 260 determines to enable the data writing circuit 220 and disable the data receiving stage circuit 210, the power supply circuit 230 and the data output stage circuit 250 according to the power down state. To be specific, under the power down state, the state controller 260 generates the enable signal EN1 to disable the input buffers 212 and 213 of the data receiving stage circuit 210, the state controller 260 generates the enable signal EN3 to disable the high voltage generating and distributing device 231 of the power supply circuit 230, and the state controller 260 generates the enable signal EN4 to enable the standby voltage pump 232 of the power supply circuit 230.

According to the above description, it is known that between the two power down states PD1, the input buffers 211-213 are maintained on the enable state. In the embodiment, the first predetermined logic level of the chip enable signal CS # is the high logic level, and the second predetermined logic level is the low logic level. However, the invention is not limited thereto, and in other embodiments, a designer may design the first predetermined logic level as the low logic level and design the second predetermined logic level as the high logic level.

Figure 5:
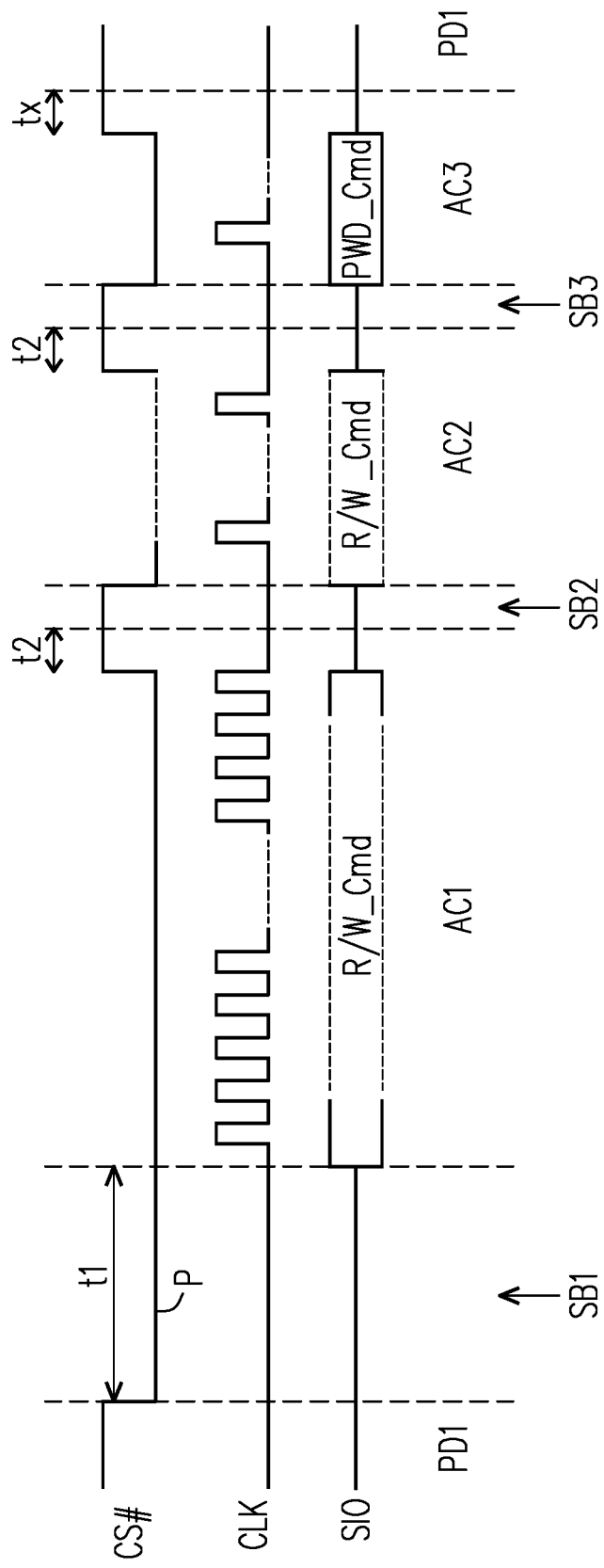
FIG. 5 is a waveform diagram according to another embodiment of the invention.

FIG. 5 is a waveform diagram according to another embodiment of the invention. A difference between FIG. 5 and FIG. 4 is that when the power down state is ended, the chip enable signal CS # does not generate the low voltage pulse, but is changed from the high logic level to the low logic level and maintained on the low logic level. Referring to FIG. 2 and FIG. 5, under the power down state, the state controller 260 detects the pulse signal P on the chip enable signal CS #, and when determining that the chip enable signal CS # is maintained on the first predetermined logic level by the first time interval t1, the state controller 260 enters active state AC1.

Figure 6:
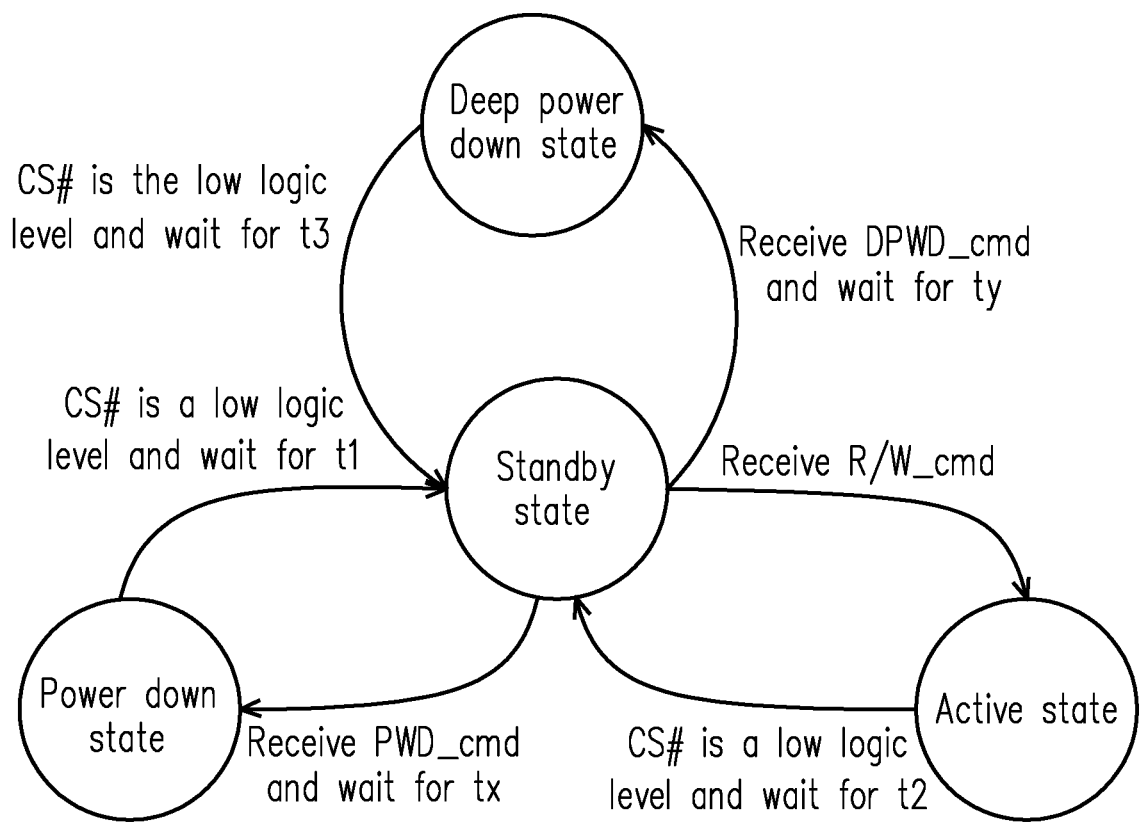
FIG. 6 is a schematic diagram of a state machine according to another embodiment of the invention.
Figure 7:
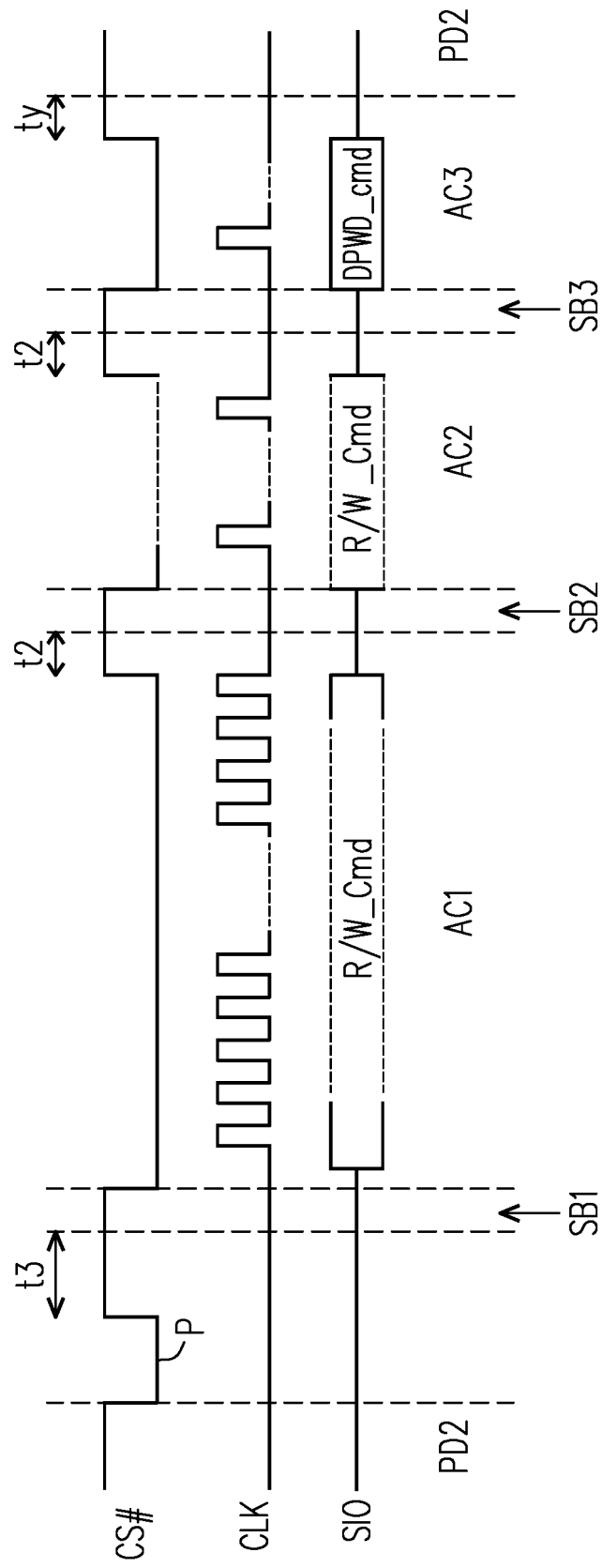
FIG. 7 is a waveform diagram according to another embodiment of the invention.

FIG. 6 is a schematic diagram of a state machine according to another embodiment of the invention, and FIG. 7 is a waveform diagram according to another embodiment of the invention. A difference between the embodiments of FIG. 6 and FIG. 3 lies in a deep power down state, and the deep power down state is described in detail below. Referring to FIG. 2, FIG. 6 and FIG. 7, under the deep power down state PD2, the state controller 260 detects the pulse signal P (for example, the low voltage pulse) on the chip enable signal CS #, and after the pulse signal P, when the state controller 260 determines that the chip enable signal CS # is maintained on the first logic level by a time interval t3, the state controller 260 enters the standby state SB1. After the chip enable signal CS # is changed to the second predetermined logic level, the state controller 260 enters the active state AC3, and receives a deep power down signal DPWD_cmd. Then, after the chip enable signal CS # is changed to the first predetermined logic level, when the state controller 260 determines that the chip enable signal CS # is maintained on the first logic level by a time interval ty, the state controller 260 re-enters the deep power down signal PD2. The state controller 260 determines to disable the data receiving stage circuit 210, the power supply circuit 230 and the data output stage circuit 250 under the deep power down state PD2. Compared to the power down state, the state controller 260 further disables the standby voltage pump 232 of the power supply circuit 230 under the deep power down state PD2.

Referring back to FIG. 2, the input buffer and the input buffer 213 may have a same framework. The input buffer 212 is used for receiving the clock signal CLK and the reference signal VREF. The input buffer 213 is used for receiving the serial input signal SIO and the reference signal VREF. In the embodiment, the input buffers 212 and 213 may be rail-to-rail input buffers. A voltage swing of the output signal of the rail-to-rail input buffer may be close to a range of a power supply voltage, which has advantages of low distortion, low noise, etc.

Figure 8:
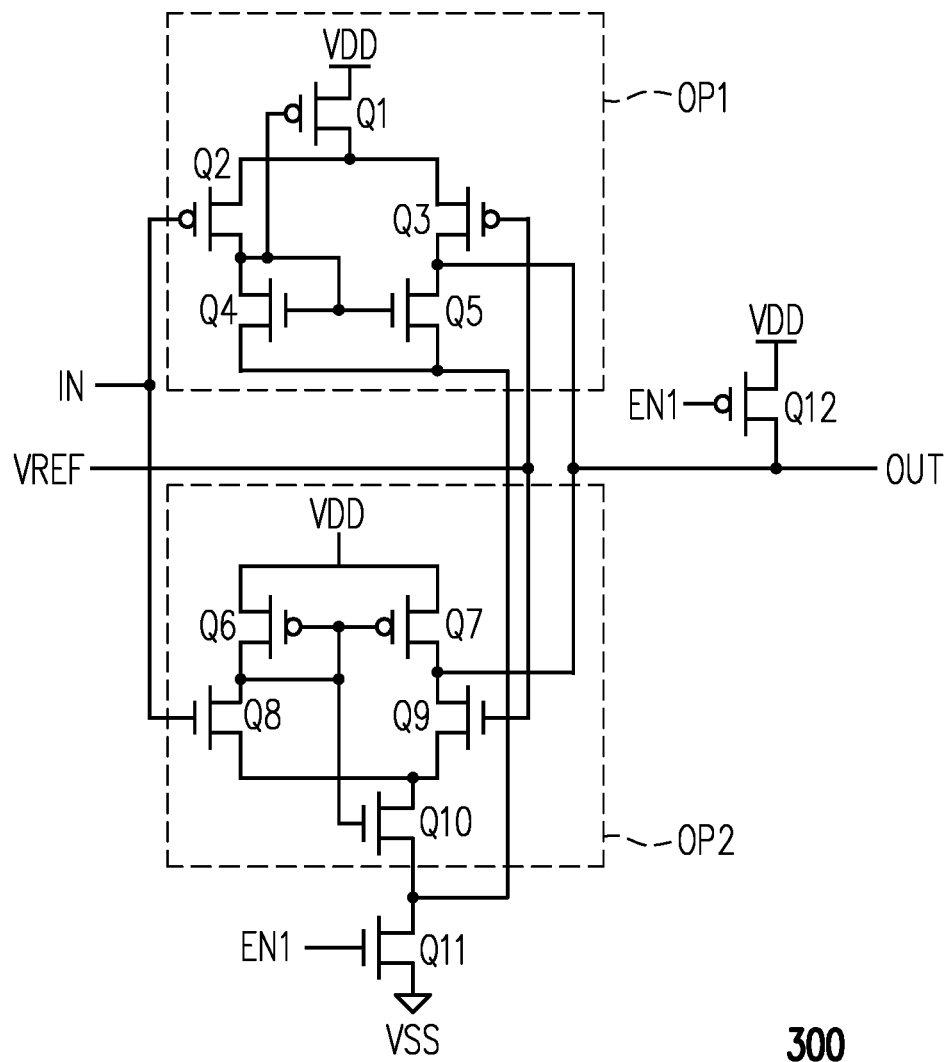
FIG. 8 is a schematic diagram of an input buffer according to an embodiment of the invention.

FIG. 8 is a schematic diagram of a rail-to-rail input buffer according to an embodiment of the invention. Referring to FIG. 8, the input buffer 300 includes two differential amplifiers OP1 and OP2. The differential amplifier OP1 includes transistors Q1-Q5, and the differential amplifier OP2 includes transistors Q6-Q10. In the differential amplifier OP1, a first terminal of the transistor Q1 receives a working voltage VDD to serve as a current source and provide a bias current. First terminals of the transistor Q2 and the transistor Q3 are coupled to each other to form a differential pair, and are connected to the second terminal of the first transistor Q1. The transistors Q4 and Q5 form an active load, a first terminal of the transistor Q4 is coupled to a second terminal of the transistor Q2, and a first terminal of the transistor Q5 is coupled to a second terminal of the transistor Q3. Second terminals of the transistors Q4 and Q5 receive a reference ground voltage VSS through a transistor Q11.

Similarly, in the differential amplifier OP2, the transistors Q6 and Q7 form an active load. A first terminal of the transistor Q6 and a first terminal of the transistor Q7 are coupled to each other and receive the working voltage VDD. A first terminal of the transistor Q8 is coupled to a second terminal of the transistor Q6, and a first terminal of the transistor Q9 is coupled to a second terminal of the transistor Q7. Second terminals of the transistors Q8 and Q9 are coupled to each other and connected to a first terminal of the transistor Q10. A second terminal of the transistor Q1.0 is coupled to the reference ground voltage VSS through the transistor Q11, so as to provide the bias voltage.

A control terminal of the transistor Q2 receives an input signal IN (for example, the clock signal CLK or the serial input signal SIO), and control terminals of the transistors Q3 and Q9 are coupled to each other and receive the reference voltage VREF. Control terminals of the transistors Q4 and Q5 are coupled to each other and connected to the second terminal of the transistor Q2, and a control terminal of the transistor Q10 is coupled to the second terminal of the transistor Q2. A control terminal of the transistor Q1 receives a voltage at the second terminal of the transistor Q2. Control terminals of the transistor Q6 and Q7 are coupled to each other and connected to the first terminal of the transistor Q8. The first terminal of the transistor Q5 and the second terminal of the transistor Q7 are coupled to each other and provide an output signal OUT. A first terminal of a transistor Q12 receives the working voltage VDD, and a second terminal of the transistor Q12 is coupled to the output signal OUT. Control terminals of the transistors Q11 and Q12 receive the enable signal EN1, and the enable signal EN1 is generated by the state controller 260. The input buffer 300 may be enabled or disabled according to the enable signal EN1.

In the embodiment, the transistors Q1-Q3, Q6, Q7 and Q12 may be P-type transistors, and the transistors Q4, Q5, Q8-Q11 may be N-type transistors. In another embodiment, the input buffer 300 may also be a non-rail-to-rail differential amplifier. In other embodiments of the invention, the input buffer 300 may also only include the differential amplifier OP1 or the differential amplifier OP2.

In summary, in the invention, the state controller is configured to control the enable/disable state of each of the components in the memory circuit, so as to achieve a lower power consumption effect. Moreover, the voltage swing of the output signal of the rail-to-rail input buffer of the memory circuit may be close to the range of the power supply voltage, so as to achieve advantages of high-speed signal operation, low distortion, low noise, etc.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A memory circuit, having a memory cell array, and comprising:
   a data receiving stage circuit, configured to receive a serial input signal and a chip enable signal;
   a data writing circuit, coupled to the data receiving stage circuit, and configured to generate at least one of a command signal and a data signal according to the serial input signal;
   a power supply circuit, configured to generate an operating voltage for the memory cell array to perform a data access operation;
   a data output stage circuit, coupled to the memory cell array, and configured to output a readout data; and
   a controller, coupled to the data writing circuit and the power supply circuit, and configured to:
   perform a switching operation of an operating state of the memory circuit according to a changing state of the chip enable signal; and
   determine a disable or enable state of the data receiving stage circuit, the data writing circuit, the power supply circuit and the data output stage circuit according to the operating state of the memory circuit.

2. The memory circuit as claimed in claim 1, wherein the operating state comprises a standby state, an active state and a power down state, and the controller is further configured to:
   determine to enable the data receiving stage circuit and the data writing circuit and disable the power supply circuit and the data output stage circuit according to the standby state;
   determine to enable the data receiving stage circuit, the data writing circuit, the power supply circuit and the data output stage circuit according to the active state; and
   determine to enable the data writing circuit and disable the data receiving stage circuit, the power supply circuit and the data output stage circuit according to the power down state.

3. The memory circuit as claimed in claim 2, wherein
   under the power down state, the controller detects a pulse signal on the chip enable signal, and after the pulse signal, the controller enters the standby state when determining that the chip enable signal is maintained on a predetermined logic level by a first time interval;
   under the standby state, the controller enters the active state when receiving a read/write command;
   under the active state, the controller enters the standby state when determining that the chip enable signal is maintained on a second predetermined logic level by a second time interval; and
   under the standby state, the controller enters the power down state when receiving the power down command.

4. The memory circuit as claimed in claim 2, wherein the power supply circuit comprises:
   a voltage generator, coupled to the controller, and generating a working voltage under the active state; and
   a standby voltage pump, coupled to the controller, and generating a standby voltage under the standby state,
   wherein the voltage generator is enabled according to the active state, and is disabled according to the standby state and the power down state, and the standby voltage pump is enabled according to the active state, the standby state and the power down state.

5. The memory circuit as claimed in claim 2, wherein the operating state further comprises a deep power down state, the controller is further configured to disable the data receiving stage circuit, the power supply circuit and the data output stage circuit according to the deep power down state.

6. The memory circuit as claimed in claim 5, wherein
   under the standby state, the controller enters the deep power down state after receiving a deep power down signal by a third time interval;
   under the deep power down state, the controller enters the standby state when determining that the chip enable signal is maintained on the first logic level by a fourth time interval.

7. The memory circuit as claimed in claim 6, wherein the power supply circuit comprises:
   a voltage generator, coupled to the controller, and generating a working voltage under the active state; and a standby voltage pump, coupled to the controller, and generating a standby voltage under the standby state, wherein the voltage generator is enabled according to the active state, and is disabled according to the standby state, the power down state and the deep power down state, and the standby voltage pump is enabled according to the active state, the standby state and the power down state, and is disabled according to the deep power down state.

8. The memory circuit as claimed in claim 6, wherein the data receiving stage circuit, the power supply circuit and the data output stage circuit are disabled according to the deep power down state.

9. The memory circuit as claimed in claim 1, wherein the data receiving stage circuit comprises:
 a first input buffer, configured to receive the serial input signal; and
 a second input buffer, configured to receive the chip enable signal;

wherein the data writing circuit comprises:
 a register circuit, coupled to the first input buffer and the second input buffer, and configured to temporarily store the serial input signal and the chip enable signal;
 an analytical circuit, coupled to the register circuit, and generating at least one of the command signal and the data signal according to the serial input signal.

10. The memory circuit as claimed in claim 1, wherein the data output stage circuit comprises:
 a sensing amplifier, coupled to the memory cell array, and configured to generate at least one sensing signal;
 a multiplexer, coupled to the sensing amplifier, the multiplexer receiving the at least one sensing signal, and outputting one of the at least one sensing signal to serve as the readout data; and
 an output buffer, coupled to the multiplexer, and configured to output the readout data and a shielding indication signal.

* * * * *